United States Patent [19]
Patino et al.

[11] Patent Number: 5,384,459
[45] Date of Patent: Jan. 24, 1995

[54] ILLUMINATED SWITCH AND KEYPAD ASSEMBLY HAVING A LIGHT GRADIENT AND A LIGHT CONDUCTIVE ELASTOMERIC ASSEMBLY

[75] Inventors: Joseph Patino, Plantation; Henry A. Bogut, Coral Springs; Pedro P. Hernandez, Sunrise, all of Fla.

[73] Assignee: Motorola, Inc., Schaumburg, Ill.

[21] Appl. No.: 69,319

[22] Filed: Jun. 1, 1993

[51] Int. Cl.⁶ ............................................. G01D 5/34
[52] U.S. Cl. ...................... 250/229; 341/31; 200/5 A
[58] Field of Search .............. 250/229, 221, 214 PR, 250/227.22; 340/870.08; 341/31, 22; 200/5 A, 313–317, 512, 517, DIG. 47

[56] References Cited
U.S. PATENT DOCUMENTS

| | | | |
|---|---|---|---|
| 3,519,116 | 7/1970 | Koehn | 250/227.22 |
| 3,937,952 | 2/1976 | Ripley et al. | 250/227.22 |
| 4,636,593 | 1/1987 | Novak et al. | |
| 4,641,026 | 2/1987 | Garcia, Jr. | 250/229 |
| 4,916,262 | 4/1990 | Jungels-Butler et al. | |
| 5,034,602 | 7/1991 | Garcia, Jr. et al. | 250/229 |
| 5,153,590 | 10/1992 | Charlier | |

OTHER PUBLICATIONS

Ealing Electro-Optics Inc., data sheet disclosing optical filter, Aug. 1992, 4 pages.

*Primary Examiner*—David C. Nelms
*Assistant Examiner*—Que T. Le
*Attorney, Agent, or Firm*—Pedro P. Hernandez

[57] ABSTRACT

A switch assembly (100) includes a key area (104) and a light reception section (114) for receiving light from input lightpipe (106) and providing some of the light to key area (104). Switch assembly (100) further includes an output lightpipe (122) and an optical conversion section (116) for modifying the light which is received by output lightpipe (122) when key area (104) is activated.

10 Claims, 4 Drawing Sheets

ILLUMINATED SWITCH AND KEYPAD ASSEMBLY HAVING A LIGHT GRADIENT AND A LIGHT CONDUCTIVE ELASTOMERIC ASSEMBLY

TECHNICAL FIELD

This invention relates in general to switch assemblies, and more specifically to illuminatable switch assemblies.

BACKGROUND

Remote microphone/keypad assemblies such as those used with radio communication equipment (e.g., two-way radios, etc.) are susceptible to radio frequency interference (RFI) as well as electromagnetic interference (EMI). RFI and EMI are found in portable radio applications and especially in mobile radio applications where a mobile radio is mounted in the trunk of a vehicle and the microphone/keypad assembly is wired through the car into the passenger compartment. In such vehicular installations, the push-to-talk switch (PTT switch), keypad and microphone signals are very susceptible to interference.

Another problem encountered in vehicular installations is the voltage drop caused by the extended cable lengths between the microphone assembly and the communication device. Usually, the keypad and PTT signals generated at the remote microphone/keypad assembly are "read" by an analog-to-digital (A/D) converter circuit in the mobile radio which is looking for a particular voltage level corresponding to the button presses. When the extended cable lengths are added, the voltage windows detected by the A/D converter are altered due to the voltage drop caused by the cable's resistance. Also, such long cable lengths act as antennas which increase the possibility of picking up unwanted noise by the cable connecting the remote microphone/keypad assembly with the radio.

Another problem associated with current remote microphone keypad assemblies is that in order to illuminate the keypad, most present day keypad assemblies use an elastomer membrane keypad, a lightpipe in back of the elastomeric membrane, and a light source such as a small incandescent light bulb all located in the remote microphone/keypad assembly. The problem presented by having such a design is that it is required to route supply voltage and ground potential lines through the cable connecting the remote microphone/keypad to the radio, which are susceptible to line losses and interference.

Finally, in applications where an illuminatable keypad or switch is required, present keypad or switch designs require one set of circuitry be used to illuminate the keypad assembly or switch, and another set of circuitry be used to decode the keypad/switch in order to determine when the keypad or switch have been activated. These current designs not only increase the chances of interference as explained previously, but increase the cost and size of the keypad assembly. A need thus exists for an illuminated switch assembly which can provide for immunity from RFI/EMI interference, voltage drops, as well be able to use the circuitry used in illuminating the keypad to decode the key(s) when they are activated.

DETAILED DESCRIPTION OF THE PREFERRED EMBODIMENT

Figure 1:
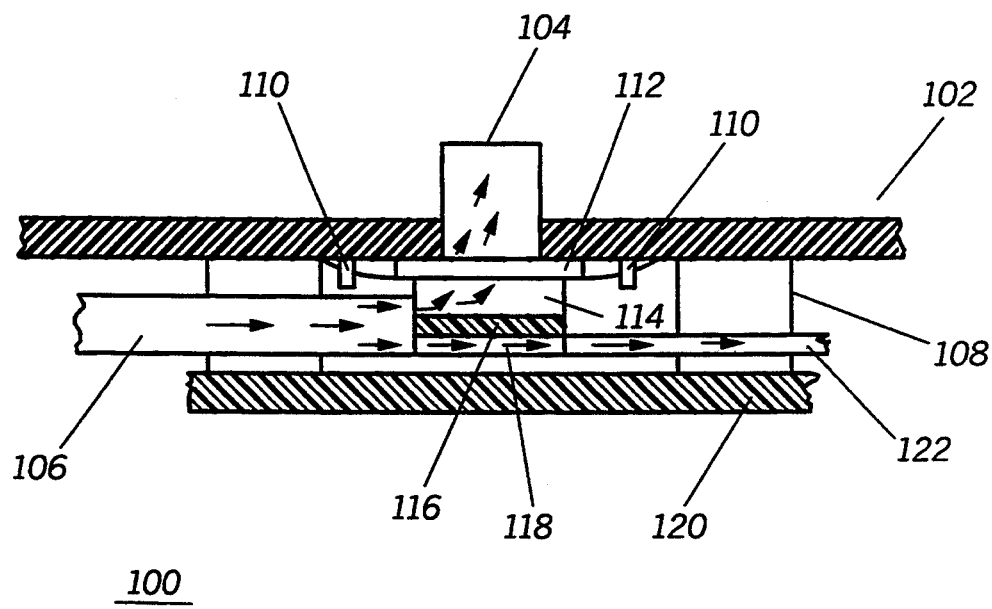
FIG. 1 is cross-sectional view of an illuminatable switch assembly in accordance with the present invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, a cross-sectional view of an illuminatable (i.e., capable of being illuminated) switch assembly 100 in accordance with the present invention is shown. Switch assembly 100 includes an elastomer key switch assembly 112 having at least one illuminatable key portion 104. Elastomeric assembly 112 is preferably formed from a light conductive material such as silicone rubber or other similar material. Elastomeric keypad assembly 112 is attached to housing 102 by way of attachment pins 110 which retain elastomeric assembly 112 to housing 102. Attachment pins 110 can be housing extensions protruding from housing 102 which mate to apertures located on key switch assembly 112, and which are bonded using adhesives or attached in other known ways to key switch assembly 112. Elastomeric assembly 112 further includes an optical conversion means, preferably an attenuation means such as a light gradient (optical filter) 116. Optical filter 116 can also be designed as a light shutter which prevents light from traveling along its length. In the preferred embodiment, section 116 is a light gradient which is molded as part of elastomeric assembly 112 using well known techniques such as double-shot molding, etc. Light gradient 116 will only allow a predetermined amount of light to travel through it which is dependent on the physical characteristics of the gradient. The amount of light which gradient 116 allows to pass preferably is unique to key 104. For example, if key 104 corresponds to the number "1", gradient 116 will provide a reduction in the amplitude of light which uniquely corresponds to key 104 when it is decoded in order for the decoder to recognize that the number "1" key has been activated.

Assembly 100 also includes an input light means such as an input light pipe or optical fiber 106 which provides light to key 104. Input lightpipe (light guide) 106 is optically coupled to a light source (not shown) such as an incandescent light, light-emitting diode, etc. Light travels through input pipe 106 and up through light reception means 114 which is also a light conductive section which is attached to or is an integral part of key section 104. As shown in FIG. 1, lightpipe 106 has a larger diameter than output lightpipe 122 in order to cover the width of light reception means 114 and light gradient 116. When key 104 is not activated (depressed), light also travels from lightpipe 106 through bottom key section 118 which acts as a movable light guide which allows light from lightpipe 106 to travel to an output port such as light receptor port 122. Light receptor port 122 is preferably a light pipe which is in optical proximity to movable light guide 118. Light receptor pipe 122 then sends the received light to a key decoding circuit which will be explained in detail later in the description. Housing 102 further includes lightpipe support members 108 which help maintain light pipes 106 and 122 aligned to the key switch and in optical proximity to movable light guide 118. Finally, a substrate such as a printed circuit board 120 is attached to said light support members 108.

Figure 2:
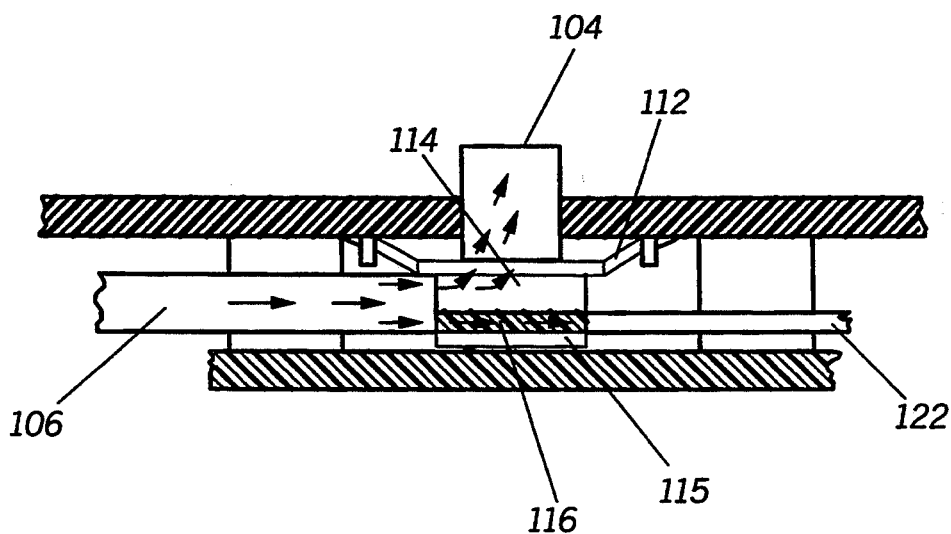
FIG. 2 shows the switch assembly of FIG. 1 with the switch in the depressed position.

Referring now to FIG. 2, the same key switch assembly as shown in FIG. 1 is shown, but now with key 104 in the depressed or activated position. When key 104 is depressed, a portion of elastomeric section 112 moves downward, causing light gradient 116 to move downward. When light gradient 116 is moved downward, it causes the amount of light being received by output light pipe 122 to be modified (e.g., when key 104 is activated only 80% of the light previously received is received, etc.). The amount of change in the amplitude of light being received by output light port 122 will depend on the characteristics of light gradient 116.

The decoder (not shown) which is coupled to lightpipe 122 can then determine that key 104 has been pressed using well known optical decoding circuits. As shown in FIGS. 1 and 2, the present invention provides both keypad illumination and key decoding using a single light source. In applications where the illumination of key 104 is required to be controllable, light pipe 106 can be designed as two light pipes which are coupled to the same light source, except that an optical switch is coupled to the light pipe providing light to light reception section 114 in order to control when illumination of key 104 is to be provided.

Figure 3:
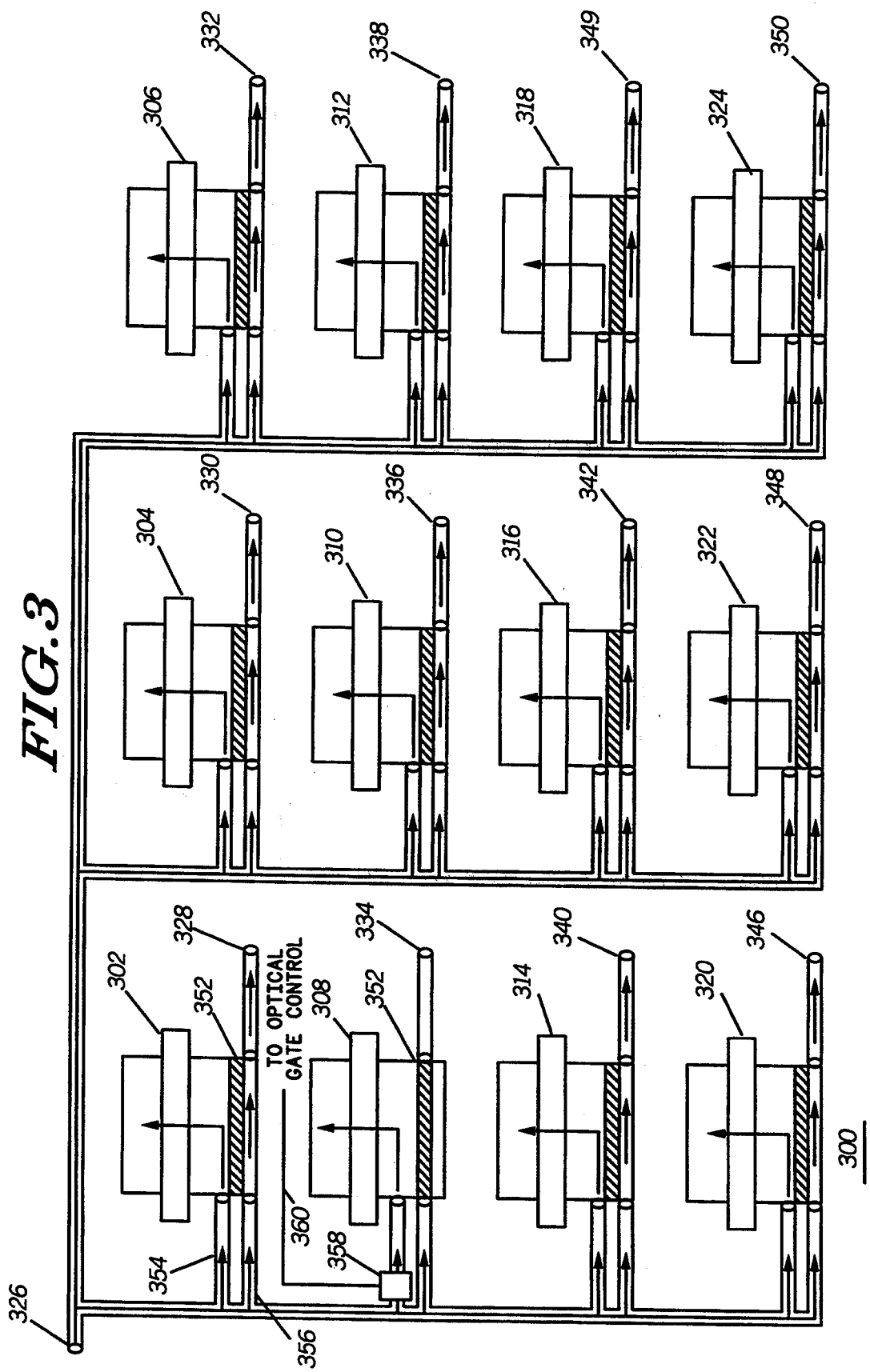
FIG. 3 is a block diagram of a simplified keypad assembly using light shutters in accordance with the present invention.

In FIG. 3, a block diagram of a simplified switch assembly in accordance with the present invention is shown. Each of the keys 302-324 in FIG. 3 uses a light blocking portion 352 which completely blocks light from traveling between input pipe 356 and receptor pipe 328-350 when a key is activated. A main input light pipe 326 receives light from a light source and distributes the light to each individual key 302-324. The light traveling via light pipe 326 is then spilt into two pipes 354 and 356 when entering into each individual key 302-324. Since in this embodiment, light blocking portion completely blocks light from traveling into each key's individual receptor pipe 328-350, each key requires an independent decoder to be attached to each key's receptor pipe 328-350 in order to determine which key 302-324 has been activated. Key 308 is shown having an optical gate 358 whether or not key 308 will be illuminated. It is preferably that a separate light pipe coming from the light source be used as the input light pipe to all keys 302-324 so that only one optical gate be required to be used instead of one for each individual key 302-324. Optical gate 358 is controlled via an optical gate control signal 360 which preferably comes from a controller located in the electronic device which is attached to keypad assembly 300.

When illumination is not necessary each the optical gate will block light from illuminating the keys.

Figure 4:
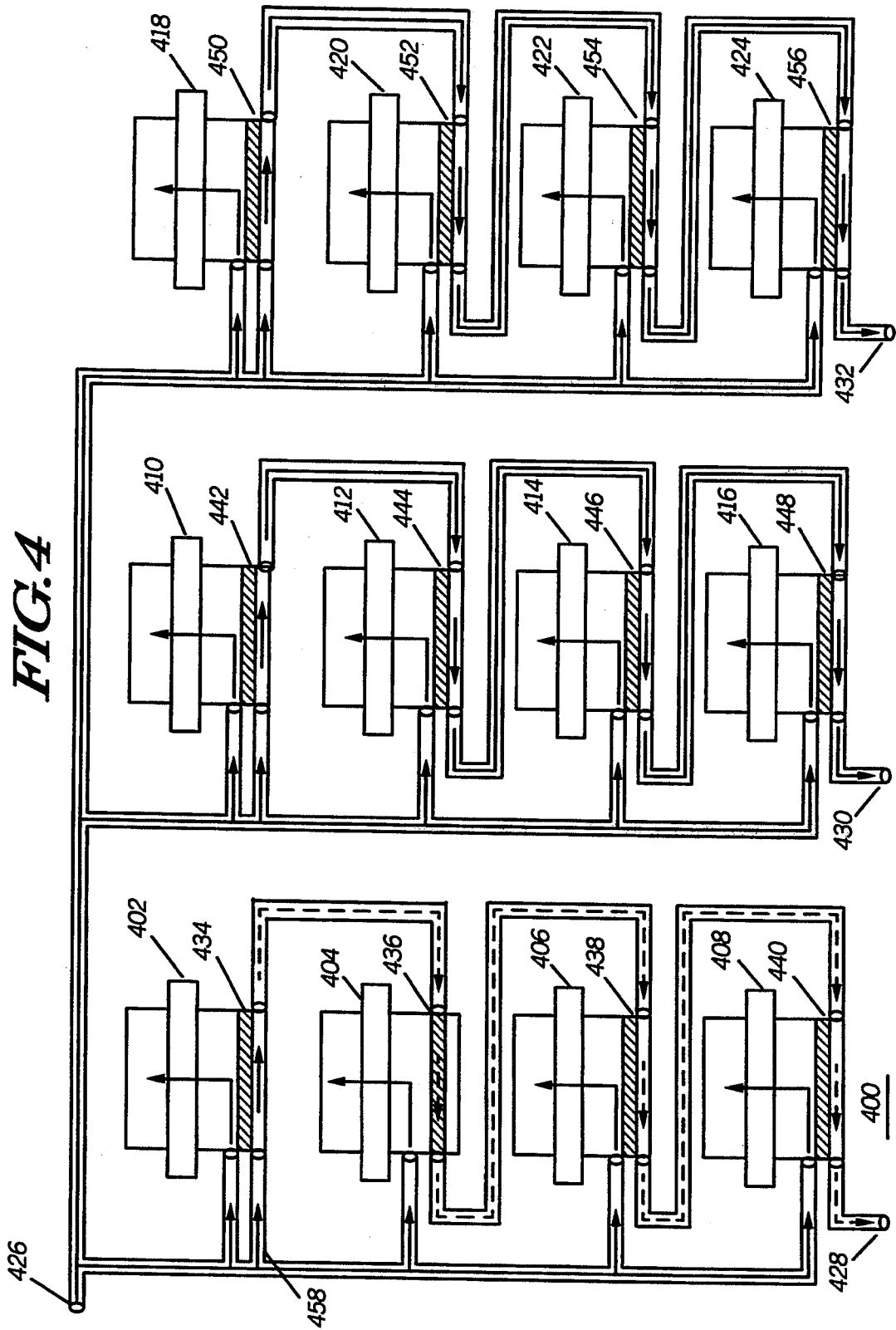
FIG. 4 is a block diagram of a simplified keypad assembly using light gradients in accordance with the present invention.

Referring now to FIG. 4, a second embodiment is shown which uses different light gradients 434 instead of a light blocking shutter 352, as shown in FIG. 3. Each key in each column of keys 402-408, 410-416 and 418-424 has a unique optical gradient which corresponds to each key in the column. For example, key 402 could have a light gradient which blocks 20% of the light flowing through lightpipe 458 when key 402 is depressed, key 404 could have a gradient which blocks 40% of the inputted light, etc. Since each key in the column would have a unique light gradient 434, only three optical decoders are required to implement the switch assembly. In this particular embodiment, the column decoders receiving the light exiting via light pipes 428,430 and 432 would each have to be able to distinguish at least 4 unique light amplitude levels in order to determine which key in its column has been depressed. One could also choose the light gradients to be used in such a fashion that one could press two keys in a column and the decoder could, given the outputted light amplitude at output ports 428-432, be able to determine which keys had been activated in the column. This would require an optical decoder which could distinguish between more than 4 light amplitude levels, as well as designing the light gradients in a way that when two keys are simultaneously activated the outputted amplitude would be different than that which could be achieved by activating anyone key alone.

Although FIGS. 1-4 have shown the implementation of the present invention as a push button keypad assembly, the present invention could also be used in rotary switches, slide switches and any other switch which requires illumination. In the particular case of a rotary switch having discrete stops (e.g., a channel selector switch in a radio), a different light gradient could be associated with each discrete switch stop in the switch in order to be able to determine the switch position the switch has selected. In the case the rotary switch is a variable switch, a linearly variable light gradient could be used such are known in the art in order to optically generate the variable resistive setting found in such variable switches (i.e., potentiometers).

Figure 5:
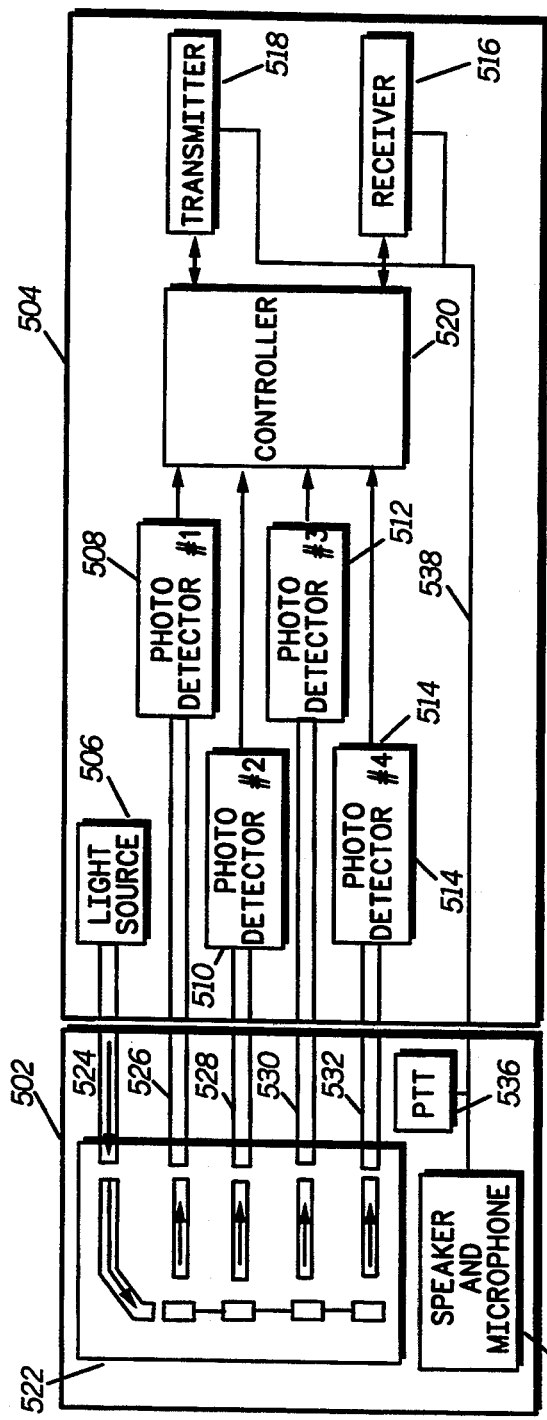
FIG. 5 is a block diagram of a keypad assembly coupled to a communication device in accordance with the present invention.

A block diagram of a keypad assembly coupled to a communication device in accordance with the present invention is shown in FIG. 5. Communication device 504 is a two-way radio such as a mobile frequency modulated (FM) transceiver. Radio 504 is typically mounted in the trunk of a automobile with remote control unit 502 coupled to radio 504 via a cable assembly allowing for control unit 502 to be placed in the passenger compartment. Control unit 502 includes a keypad section 522 similar to keypad 300, as well as a speaker/microphone section 534 and PTT switch 536 which are coupled to communication device 504 via electrical bus 538. In this embodiment, each individual key which forms keypad assembly 522 is using a light blocking shutter as previously discussed in relation to keypad 300.

A light source 506 such as an incandescent bulb, provides light to keypad assembly 522 via lightpipe 524. The light flowing through lightpipe 524 provides illumination to each individual key forming keypad 522. Also, the light flowing through light pipe 524 is used in decoding the individual keys as previously described. A set of optical (photo) detectors 508-514 are used to determine when the keys are depressed. Optical detectors 508-514 can be anyone of a number of commercially available detectors known to those in the art such as, photo-resistors, linear photo-transistors, photo-voltaic devices, etc. Optical detectors then send their output signals via optical fibers 524-532 to a controller 520, which preferably takes the form of a microcomputer such as an MC68HC11 microcomputer, manufactured by Motorola, Inc. or any other similar microprocessor. Controller 520 preferably has onboard memory and input/output ports as well as a analog/digital converter section which is used to convert the analog signals generated by optical detectors 508-514 into digital signals. Controller 520 is preferably continuously sensing the output lines of detectors 508-514 in order to determine when a key in keypad 522 has been pressed. Controller 520 is also responsible for the control of conventional transmitter 518 and receiver sections 516 which help form radio 504. Controller 520 and the associated optical detectors act as an optical decoder or decoding circuit which determine which key has been activated.

Figure 6:
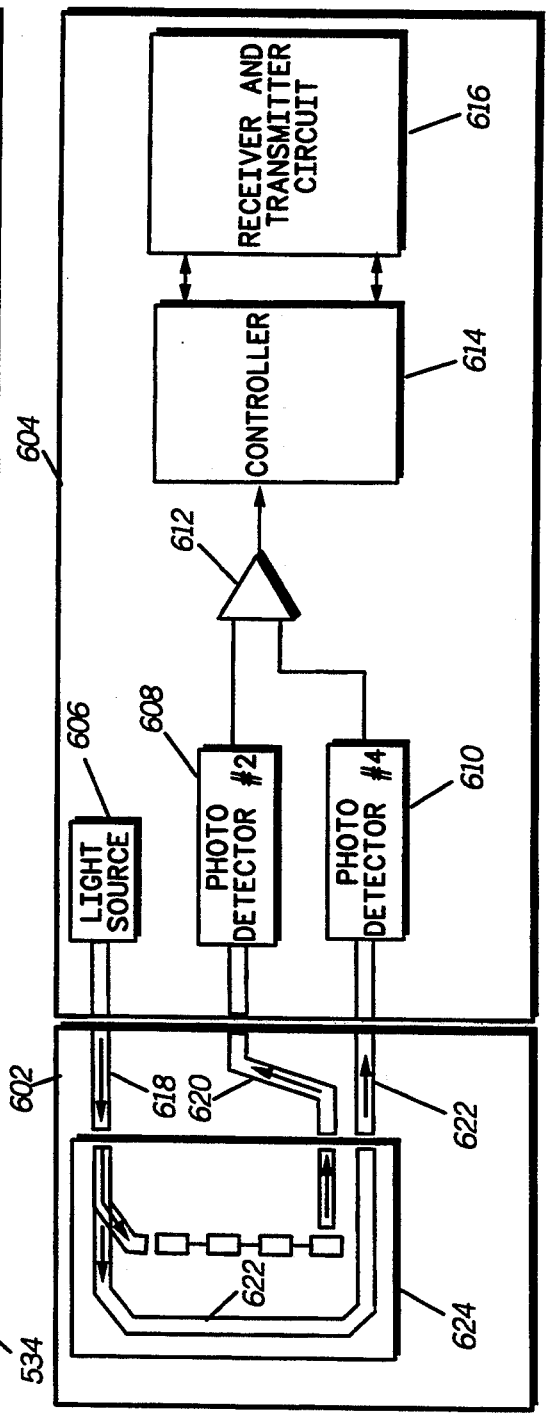
FIG. 6 is a second embodiment of a block diagram of a keypad assembly coupled to a communication device in accordance with the present invention.

In FIG. 6, a similar arrangement as that in FIG. 5 is shown, except that in this arrangement, a light gradient approach such as that shown in FIG. 4 is used. The speaker/microphone and PTT switch have been eliminated from FIG. 6 in order to highlight the present invention. In the arrangement of FIG. 6, a single optical detector is used to sense the 4 keys which make up the keypad assembly 624. A second optical path 622 is included in this embodiment and is used to equalize for any losses due to changes in light source 606 (e.g., light source 606 losing intensity due to bulb aging, problems in the cable, etc.). This second light path which sends light directly from light source 606 to second optical detector 610. The output of optical detector 608 and detector 610 are then inputted into an equalizing amplifier 612. Equalizing amplifier 612 can be an operational amplifier circuit which compensates for changes in the output of detector 610 so that changes in the light amplitude not caused by key activation are compensated for in the output of detector 608.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

In summary, switch assembly (100) provides for both illumination and decoding of the switch assembly using a single source of light. Furthermore, by providing for a totally optical switch assembly (100), susceptibility of the switch assembly to EMI and RFI and voltage drop problems is reduced substantially.

We claim:

1. A switch assembly, comprising:
    a light source for providing light;
    an optical decoder;
    first and second switches optically coupled to both the light source and the optical decoder, said first and second switches can each be operated between first and second states, each of the first and second switches comprising:
    an illuminatable switch portion;
    light reception means for receiving light from the light source and providing some of said light to the illuminatable switch portion; and
    a light gradient coupled to the light reception means for controlling the amount of light which is sent to the optical decoder when the switch is switched from the first to the second state;
    the light gradients on the first and second switches are different from one another such that each one blocks a different amount of light from getting through to the optical decoder; and
    the optical decoder can determine whether the first and second switches are in the second state by the amount of light received at the optical decoder.

2. A switch assembly, as defined in claim 1, further comprising:
    a second optical decoder;
    a second light reception means for receiving light from the light source and providing some of said light to the second optical decoder;
    an equalizing circuit; and
    the first and second optical decoders each provide an output signal to the equalizing circuit in order to compensate for any changes in the amount of light provided by the light source.

3. A switch assembly as defined in claim 1, wherein the light reception means comprises a light conductive section coupled to the illuminatable switch portion.

4. A switch assembly as defined in claim 1, wherein the first and second switches are push-button switches and the first and second switches can be placed in the second state of operation by depressing the illuminatable switch portion.

5. A switch assembly as defined in claim 1, wherein the illuminatable switch portion of the first and second switches stays illuminated by the light provided by the light source in both the first and second states of operation and the light provided by the light source is also used to determine if either or both of the first and second switches are in the second state of operation.

6. A switch assembly as defined in claim 1, wherein the optical decoder can also determine if both the first and second switches are in the second state of operation at the same time.

7. A keypad assembly, comprising:
    a housing having first and second apertures;
    a keypad attached to said housing, said keypad including first and second keys, the first key protruding through said first aperture and the second key protruding through said second aperture;
    an input light means optically coupled to the keypad for providing light to the keypad;
    light reception means coupled to each of the first and second keys for receiving light from the input light means and providing some of said light to the first and second keys;
    an output light receptor port optically coupled to the keypad;
    an optical decoder: and
    a light gradient coupled to the light reception means of each of the first and second keys for controlling the amount of light which is sent to the optical decoder when the switch is switched from the first to the second state;
    the light gradients on the first and second switches are different from one another such that each one blocks a different amount light from getting through to the optical decoder; and
    the optical decoder can determine whether the first and second switches or both the first and second switches are in the second state by the amount of light received at the optical decoder.

8. A keypad assembly as defined in claim 7, wherein the light reception means comprises a light conductive section coupled to the illuminatable switch portion.

9. A keypad assembly as defined in claim 7, wherein the keypad is comprised of a light conductive material.

10. A keypad assembly as defined in claim 9, wherein the input light means and the output light receptor port comprise lightpipes.

* * * * *